(12) United States Patent
Agrawal et al.

(10) Patent No.: US 10,033,552 B2
(45) Date of Patent: Jul. 24, 2018

(54) DRIVING DATA OF MULTIPLE PROTOCOLS THROUGH A SINGLE SET OF PINS

(71) Applicant: Lattice Semiconductor Corporation, Portland, OR (US)

(72) Inventors: Vinayak Agrawal, Hyderabad (IN); Namrta Sharma, Hyderabad (IN); Nagaraj Chekka, Cupertino, CA (US); Srikanth Gondi, Sunnyvale, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 15/224,286

(22) Filed: Jul. 29, 2016

(65) Prior Publication Data

US 2017/0005836 A1 Jan. 5, 2017

Related U.S. Application Data

(63) Continuation of application No. 14/128,551, filed as application No. PCT/IB2013/000410 on Mar. 14, 2013, now Pat. No. 9,407,469.

(51) Int. Cl.
  *H04L 25/02* (2006.01)
  *H04L 5/20* (2006.01)
  (Continued)

(52) U.S. Cl.
  CPC ......... *H04L 25/0272* (2013.01); *G09G 5/003* (2013.01); *G09G 5/14* (2013.01);
  (Continued)

(58) Field of Classification Search
  CPC  H04L 25/0272; H04L 25/0276; H04L 25/028
  (Continued)

(56) References Cited

U.S. PATENT DOCUMENTS 5,703,532 A  12/1997  Shin et al.
6,351,109 B1  2/2002  Yoshida
(Continued)

FOREIGN PATENT DOCUMENTS

CN  101650928 A  2/2010
CN  102045345 A  5/2011
(Continued)

OTHER PUBLICATIONS

International Search Report & Written Opinion dated Feb. 19, 2010 for International Application No. PCT/US2009/061923, 15 pages.
(Continued)

*Primary Examiner* — Emmanuel Bayard
(74) *Attorney, Agent, or Firm* — Fenwick & West LLP

(57) ABSTRACT

Embodiments of the invention are generally directed driving data of multiple protocols through a single set of pins. An embodiment of an apparatus includes a transmitter connected to two pads on an IC the transmitter including a differential driver to transmit a differential signal, wherein the differential driver has a first branch and a second branch, each branch of the differential driver including a protection device connected to one of the pads; and a common mode driver to transmit a common mode signal, the common mode driver having a first branch and a second branch, each of the branches of the common mode driver including a protection device connected to one of the pads. The first and second switch devices are not turned on simultaneously, based on data to be transmitted, one of the switch devices being turned on and the other being turned off. The third and fourth switch devices are both turned on when the common mode signal is one of a logic HIGH or logic LOW and both turned off when the common mode signal is the other of a logic HIGH or logic LOW.

13 Claims, 16 Drawing Sheets

(51) Int. Cl.
*G09G 5/00* (2006.01)
*G09G 5/14* (2006.01)
*H03K 17/687* (2006.01)

(52) U.S. Cl.
CPC ............ *H03K 17/687* (2013.01); *H04L 5/20* (2013.01); *H04L 25/028* (2013.01); *H04L 25/029* (2013.01); *H04L 25/0276* (2013.01); *G09G 2370/10* (2013.01); *G09G 2370/12* (2013.01)

(58) Field of Classification Search
USPC ......................................... 375/257–258, 297
See application file for complete search history.

(56) References Cited

U.S. PATENT DOCUMENTS

| | | | |
|---|---|---|---|
| 6,504,432 B1 | 1/2003 | Rokhsaz | |
| 6,580,324 B2 | 6/2003 | Palaskas et al. | |
| 6,597,240 B1* | 7/2003 | Walburger | H03F 3/2171 330/10 |
| 6,972,588 B1 | 12/2005 | Wong et al. | |
| 7,145,359 B2 | 12/2006 | Hein et al. | |
| 7,218,136 B2 | 5/2007 | Kasahara | |
| 7,256,624 B2 | 8/2007 | Cheng et al. | |
| 7,256,625 B2 | 8/2007 | Liu et al. | |
| 7,345,503 B2 | 3/2008 | Chen et al. | |
| 7,573,298 B2 | 8/2009 | Sawada et al. | |
| 7,589,559 B2 | 9/2009 | Shim et al. | |
| 7,592,867 B2 | 9/2009 | Trifonov et al. | |
| 7,733,179 B2 | 6/2010 | Forejt | |
| 7,872,498 B2 | 1/2011 | Shim et al. | |
| 8,274,320 B2 | 9/2012 | Hsu et al. | |
| 8,750,391 B2 | 6/2014 | Terauchi | |
| 8,798,123 B2 | 8/2014 | Terauchi | |
| 8,823,414 B2 | 9/2014 | Thirugnanam et al. | |
| 9,496,054 B1* | 11/2016 | Lee | G11C 29/50 |
| 9,647,663 B1* | 5/2017 | Ng | H03K 19/01825 |
| 2003/0012046 A1* | 1/2003 | Lee | G11C 7/1045 365/63 |
| 2003/0099138 A1* | 5/2003 | Kyung | G11C 7/1072 365/200 |
| 2003/0218477 A1* | 11/2003 | Jang | H03K 19/0005 326/30 |
| 2004/0151196 A1* | 8/2004 | Iwasaki | H04L 25/0278 370/412 |
| 2004/0218405 A1* | 11/2004 | Yamada | H02M 3/335 363/18 |
| 2004/0222834 A1* | 11/2004 | Frans | H03K 5/003 327/165 |
| 2004/0239374 A1 | 12/2004 | Hori | |
| 2008/0246755 A1 | 10/2008 | Lee | |
| 2009/0002730 A1* | 1/2009 | Yamada | G06F 3/1204 358/1.9 |
| 2009/0174439 A1 | 7/2009 | Luo et al. | |
| 2009/0239559 A1 | 9/2009 | Hollis | |
| 2010/0104029 A1 | 4/2010 | Lee et al. | |
| 2012/0146689 A1* | 6/2012 | Lung | H03K 19/00 327/108 |
| 2012/0237053 A1* | 9/2012 | Alam | H04L 12/00 381/80 |
| 2012/0262200 A1* | 10/2012 | Shin | H03K 19/00315 326/30 |
| 2014/0028349 A1* | 1/2014 | Nakamura | H03K 19/018507 326/82 |
| 2014/0055162 A1* | 2/2014 | Jung | H03K 19/017545 326/30 |
| 2014/0331146 A1* | 11/2014 | Ronkainen | G06F 3/0482 715/741 |

FOREIGN PATENT DOCUMENTS

| | | |
|---|---|---|
| CN | 102224676 A | 10/2011 |
| CN | 102411553 A | 4/2012 |
| CN | 102811265 A | 12/2012 |
| GB | 2395876 | 6/2004 |
| WO | WO 9527353 | 10/1995 |
| WO | WO 0022499 | 4/2000 |
| WO | WO 2009058790 | 5/2009 |

OTHER PUBLICATIONS

International Preliminary Report on Patentability for International Application No. PCT/US2009/061923 dated May 12, 2011.
"Universal Serial Bus 3.0 Specification (including errata and ECNs through May 1, 2011) Revision 1.0," Hewlett-Packard Company et al., Jun. 6, 2011, 531 pages.
"Universal Serial Bus Specification Revision 2.0," Compaq et al., Apr. 27, 2000, 650 pages.
"High-Definition Multimedia Interface Specification Version 1.3," HDMI Licensing, LLC, Jun. 22, 2006, 237 pages.
Gabara, T., "Phantom Mode Signaling in VLSI Systems", Advanced Research in VLSI, 2001, ARVLSI 2001, Proceedings. 2001 Conference on Mar. 14-16, 2001, Piscataway, NF, USA, IEEE (Mar. 14, 2001), pp. 88-100; XP010538448; ISBN: 978-0-7695-1038-5.
PCT Invitation to Pay Additional Fees, PCT Application No. PCT/IB2013/000410, Apr. 15, 2014, 6 pages.
PCT International Search Report and Written Opinion, PCT Application No. PCT/IB2013/000410, dated Jul. 15, 2014, 15 pages.
United States Office Action, U.S. Appl. No. 14/128,551, dated Dec. 3, 2015, 17 pages.
Chinese First Office Action, Chinese Application No. 201380074668.4, dated Oct. 25, 2017, 6 pages (with concise explanation of relevance).

\* cited by examiner

HDMI Driver - Open Drain Architecture

HDMI Driver - Open Drain Architecture

US 10,033,552 B2

DRIVING DATA OF MULTIPLE PROTOCOLS THROUGH A SINGLE SET OF PINS

RELATED APPLICATIONS

This application is a continuation of U.S. patent application Ser. No. 14/128,551 having a 371(c) date of Dec. 20, 2013, which is a National Phase Entry of PCT Application No. PCT/IB2013/000410 filed on Mar. 14, 2013, the contents of which are each incorporated by reference herein.

TECHNICAL FIELD

Embodiments of the invention generally relate to the field of electronic devices, and, more particularly, to driving data of multiple protocols through a single set of pins.

BACKGROUND

In the transmission of signals between devices or elements, such as the transmission of audio-visual data streams, certain technologies may require the transmission of multiple different types of data streams. For example, consumer electronics and other systems may transmit and receive one or more data streams of HDMI™ (High Definition Multimedia Interface) protocol data and MHL™ (Mobile High-definition Link) protocol data.

There is a proliferation of devices that transmit, receive, store, present, render or store multi-media content that includes high-definition video and audio. The multi-media content needs to be transferred from one device to another, depending on the consumer network. For example, HDMI provides an interface that allows for the transfer of uncompressed digital high-definition video and audio, together with associated control signals. In another example, MHL provides an audio/video interface to connect portable electronic devices to other devices, allowing for transfer of HDMI information utilizing connectors with fewer pins through the multiplexing of multiple data signals, combining the three lanes of HDMI data to a single lane of multiplexed data without requiring a separate clock. Protocols for communication elements may include MHL technology. With HDMI technology, there are several lanes used for the transfer of control signals, these including being DDC (Display Data Channel) for configuration and status exchange between a source device and a sink device, an optional CEC (Consumer Electronics Control) protocol to provide high-level control function among audio visual products in a user's environment. In contrast, MHL technology may include a control bus carrying multiplexed control signals.

Electronic devices may include various interfaces for the transfer of data, but smaller devices may have limitations with regard to connections because of the physical size. For example, certain handheld and other smaller devices may utilize a micro-USB (Universal Serial Bus), mini-USB or a standard USB connector (or socket) compatible with USB protocol, or similar connector having limited space.

However, the transmission of multiple different protocols generally requires the inclusion of multiple drivers for the transmission of the data, with each data protocol utilizing a different set of pins. For this reason, the manufacture of devices that transmit multiple data protocols requires additional device area for communication, as well the additional cost of producing the required drivers and interconnects.

BRIEF DESCRIPTION OF THE DRAWINGS

Embodiments of the invention are illustrated by way of example, and not by way of limitation, in the figures of the accompanying drawings in which like reference numerals refer to similar elements.

SUMMARY

Figure 1:
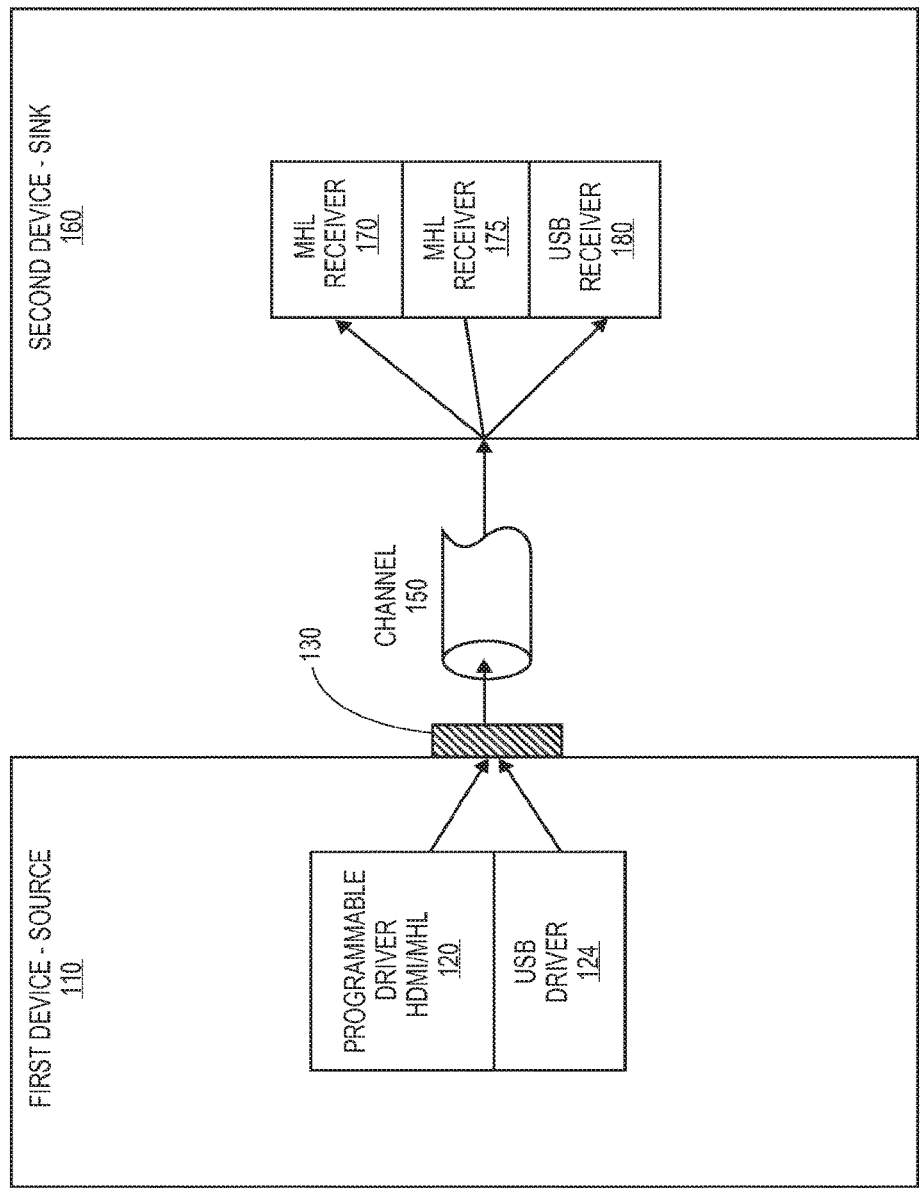
FIG. 1 is an illustration of embodiment of a communication system.

Embodiments of the invention are generally directed to driving data of multiple protocols through a single set of pins.

In a first aspect of the invention, an embodiment of an apparatus includes a transmitter connected to two pads on an IC, the transmitter including a differential driver to transmit a differential signal, wherein the differential driver has a first branch and a second branch, each branch of the differential driver including a protection device connected to one of the pads; and a common mode driver to transmit a common mode signal, the common mode driver having a first branch and a second branch, each of the branches of the common mode driver including a protection device connected to one of the pads. The first and second switch devices are not turned on simultaneously, based on data to be transmitted, one of the switch devices being turned on and the other being turned off. The third and fourth switch devices are both turned on when the common mode signal is one of a logic high or logic low and both turned off when the common mode signal is the other.

In a second aspect of the invention, an embodiment of a method includes driving a differential signal and a common mode signal on two pads of an IC with a transmitter, wherein the transmitter includes a differential driver to transmit the differential signal and a common mode driver to transmit the common mode signal. The differential driver includes a first branch and a second branch, the method further including switching the first branch and the second branch, wherein switching the first branch and the second branch includes disconnecting the first branch when connecting the second branch and disconnecting the second branch when connecting the first branch. The common mode driver includes a third branch and a fourth branch, the method further including comprising switching the third branch and the fourth branch, switching the third branch and the fourth branch includes connecting and disconnecting the third and fourth branches simultaneously. Switching the third and fourth branches includes connecting the third and fourth branches when the common mode signal is one of a logic high or logic low and disconnecting the third and fourth branches when the common mode signal is the other of logic high or logic low.

DETAILED DESCRIPTION

Embodiments of the invention are generally directed to driving data of multiple protocols through a single set of pins.

In some embodiments, an apparatus, system, or method provided for driving data of multiple protocols through a single set of pins. In some embodiments, the apparatus, system, or method provides for transmission of data of, for example, multiple alternative audio/video content protocols or other data protocols over one set of I/O connections in an integrated circuit.

In a conventional apparatus or system, a driver for each type of protocol data to be utilized is generally required. For example, an HDMI driver is used to drive HDMI data, and an MHL driver is used to drive MHL data. For this reason, if a product requires both HDMI driver and MHL driver, then two sets of pins are required, wherein a first set of pins is used to connect with the HDMI driver and a second set of pins is used to connect with the MHL driver.

In some embodiments, a single programmable driver may be used to transmit multiple data protocols, where the data protocols may include a first protocol such as HDMI and a second protocol such as MHL. The programmable driver saves extra pins/pads in a product because only a single connection is needed, and, because the HDMI driver is re-used in the MHL driver, the programmable driver further saves area on a manufactured chip.

However, device may commonly also include a port for a third protocol, such as a USB™ (Universal Serial Bus). In some embodiments, a driver for the third protocol (such as USB) also shares a single set of pins or pads for communication of data. In some embodiments, the USB driver is connected by a switch device (referred to herein as either a switch device or a switch), where the HDMI/MHL driver may be tristated when not in operation, where tristate indicates a high impedance state.

In conventional applications there are multiple devices that use one or more protocols for high definition audio/video transmission, such as, for example, HDMI, MHL, and other related technologies. The targeting of multitude of devices that have integrated circuit chips manufactured in many different process technologies poses several challenges:

(1) Because each device (for example, each set top box, television, computer. smart phone, or other device) may require different transmission protocols several designs are required to be produced in order to target several devices, thus significantly increasing the cost of semiconductor component development.

(2) For similar devices, different customers manufacture chips in different process technologies, thereby leading to several chip designs and significantly higher cost for component suppliers, even when all these devices use the same protocol.

(3) Conventional devices commonly require the use of one or more protocols in the same device so as to supply the consumer with several options, thus leading to increased costs due to extra hardware, supporting software and firmware, and intellectual property.

However, there is significant pressure to reduce the component cost for such devices while at the same time supporting as many protocols as possible on the same chip or device.

The integrated circuits (ICs) designed for each of multiple protocols generally require different interface PHY (physical layer) designs that are placed independent of each other in an IC chip. This methodology leads to significant use of die area in an IC– due to both the pad area and also due to the PHY circuits themselves. This methodology also increases the overall cost since a system engineer is required to handle two or more PHY chips or circuits for transmitting high definition audio/video data.

In some embodiments, an apparatus or system operates without a switch between a first signal path (such as an HDMI/MHL signal path) and a pin. In some embodiments, operation without the switch between the first signal path and the pin or pad allows for increasing the speed of the first link by reducing the capacitive load on the pads, as well as eliminating the bandwidth constraints that would be imposed by a switch.

In some embodiments, an apparatus or system eliminates a switch from the path of MHL in a MHL/USB implementation, thereby simplifying the implementation of an alternative data mode (USB in this example).

Because common mode signals can cause EMI (Electro-Magnetic Interference), the rise/fall time of signals such as MHL signals should be controlled. In some embodiments, an apparatus or system to control the common mode slew rate is provided. In some embodiments, independent or correlated slew rate control may be used to eliminate the need for a common mode choke to regulate/increase the rise/fall time in a controlled manner, and thus reducing system cost. In some embodiments, a driver includes controlled rise/fall times in the driver by design, thereby eliminating the need for a common mode choke to increase the rise/fall time in a controlled manner.

In some embodiments, an apparatus or system reduces the possibility of CM-DM (Common mode to Differential mode) conversion that eats into eye margin. In this case, for example, the MHL clock is the common mode signal and the MHL data is the differential signal. The provision of a better eye margin thus may make higher speeds of operation achievable.

In some embodiments, a simplified driver architecture allows for the traces on a PCB (printed circuit board) to be microstrip lines (instead of commonly used striplines) thereby saving cost by allowing fewer layers in the PCB. In some embodiments, a device may generate less noise on supply and ground (by the way of slow rise/fall at the output), thereby allowing for less expensive package, including reduced need for D-cap (decoupling capacitance), and thus less area is required for the device because of the reduction in needed components.

In some embodiments, a single chip can support MHL and HDMI. In some embodiments, for a large system on chip (SoC), one mask variant may be utilized to support two applications (one with HDMI output, another with MHL output), thus reducing design, manufacturing and inventory costs.

FIG. 1 is an illustration of embodiment of a communication system. In this illustration, a first device (which may be referred to as a source device) 110 transmits data via a channel 150 to a second device (which may be referred to as a sink device) 160. While FIG. 1 illustrates a data transmission from the source device 110 to the sink device 160, the system may include bidirectional communications.

In some embodiments, the source device 110 may transmit data of multiple protocols to the sink device 160. In this illustration, the source device may transmit HDMI data (a first protocol), MHL data (a second protocol), and USB data (a third protocol). In some embodiments, the source device 110 includes a first programmable driver 120 providing for the transmission of data of the first protocol and the second protocol. In some embodiments, the source device further includes a second USB driver 124 for the transmission of USB data. In some embodiments, the first driver 120 and the second driver 124 are transmitted via a single set of pins 130. As illustrated, the sink device 160 includes receivers for the receipt of the transmitted data, which is illustrated here as an HDMI receiver 170, an MHL receiver 175, and a USB receiver 180.

Figure 2B:
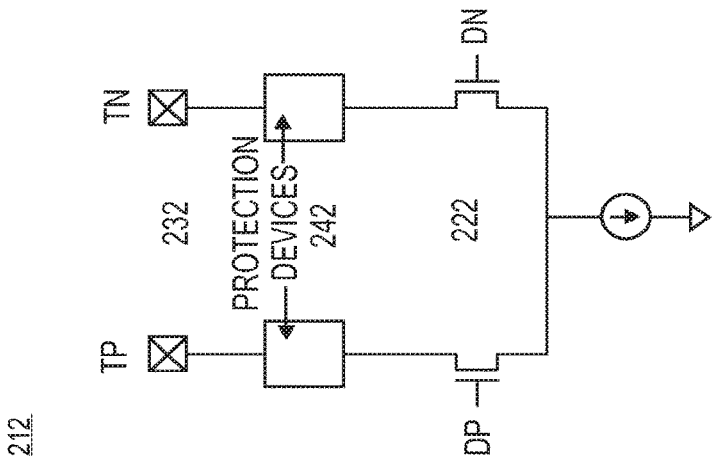
FIG. 2B is an illustration of an open-collector differential transmitter utilizing MOS (metal oxide semiconductor) devices.
Figure 2A:
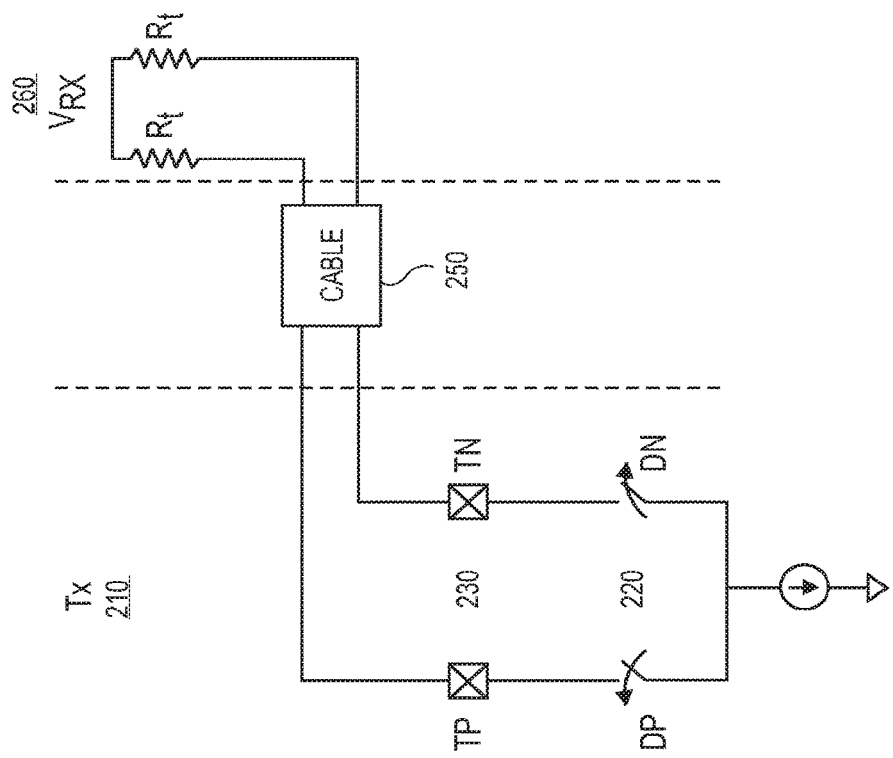
FIG. 2A is an illustration of an open-collector differential transmitter.

FIG. 2A is an illustration of an open-collector differential transmitter. In a conventional circuit for a data protocol (such as HDMI), a transmitter 210 is coupled via a cable 250 to a receiver 260. In the illustrated system, the differential input (shown by switches DP and DN 220) steer a common current to the output pins or pads (TP and TN) 230 to generate differential outputs. The differential outputs are terminated at the receiver 260, as illustrated with termination resistances $R_t$ and the received signal $V_{RX}$.

FIG. 2B is an illustration of an open-collector differential transmitter 212 utilizing MOS (metal oxide semiconductor) devices. In some implementations, switches, such as illustrated as 220 in FIG. 2A, may be replaced by MOS switch devices (DP and DN 222). The MOS devices 222 can be protected against high pad voltages by cascoding using protection devices 242 between the MOS devices 222 and the pads TP and TN 232.

Figure 3:
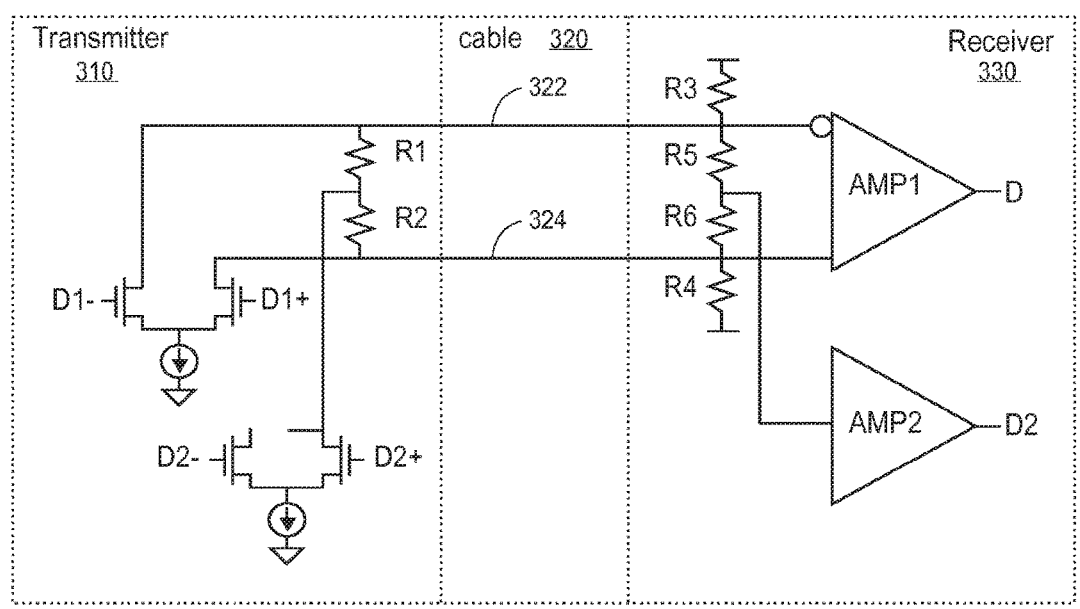
FIG. 3 is an illustration of a conventional apparatus to transfer a common mode signal on differential data.

FIG. 3 is an illustration of a conventional apparatus to transfer a common mode signal on differential data. As illustrated, a transmitter 310, such as an MHL driver, is coupled to a receiver 330 via a cable 320 having a first conductor 322 and a second conductor 324. For example, an MHL driver includes transference of a common signal. U.S. patent application Ser. No. 12/603,176 by Lee, et al., describes a method to transfer a common mode signal on the differential data.

In FIG. 3, the transmitter 310 includes differential signal D1 provided as D1+ (at a gate of D1+ transistor) and D1− (at gate of D1− transistor) across termination resistors R1 and R2 and common mode signal D2 provided as D2+ (at gate of D2+ transistor) at the node between R1 and R2. At the receiver 330, the resistances are coupled such that R3 is connected between a first voltage potential and the first conductor 322, R5 is connected between the first conductor 322 and a node connecting R5 and R6, R6 is between the node connection with R5 and the second conductor 324, and R4 is connected between the second conductor 324 and a second voltage potential. The first conductor 322 and the second conductor are coupled to a first amplifier AMP1 to amplify the received differential signal and the node between R5 and R6 is coupled with a second amplifier AMP2 to amplify the received common mode signal.

However, such an apparatus or system as illustrated in FIG. 3 requires termination resistance on the transmitter side to isolate outputs (+ve and −ve outputs), where extra termination resistance increases ground current consumption. The termination resistance for an MHL driver should not be large, where a large MHL termination resistance will pull down the drain node of the D2+ transistor. The maximum resistance for MHL is thus limited by the minimum voltage required for D2 transistor and the current source at its source to work correctly. Termination resistance of an HDMI driver is larger, and can be turned OFF. Since the termination resistance required in this MHL transmitter implementation is smaller, it is difficult to turn it OFF. The switches required to turn off this resistance have to be very large (in order to have low DC resistance), and will add undue capacitance.

The termination resistors also modify the VH specification for the MHL driver even for low speeds. However, HDMI allows for a maximum 10 mV difference between VH and VTERM (Receiver termination voltage) at speeds less than 1.65 Gbps. As a result a common HDMI-MHL driver is challenging to build. Extra termination will also increase ground current consumption, even from differential nets. This increases the power consumption without any benefit for signal integrity.

In this illustration, R1 and R2 (which together form the MHL termination resistance of transmitter 310) should be equal. Any difference between R1 and R2 will manifest itself as common mode to differential-mode conversion, thus affecting the differential data integrity.

In this illustration, the D1 signal is a differential signal and the D2 signal is a common mode signal, where the common mode rise and fall time may not be well controlled. Because common mode signals can cause EMI, the rise and fall times of MHL signals should be controlled.

Figure 3A:
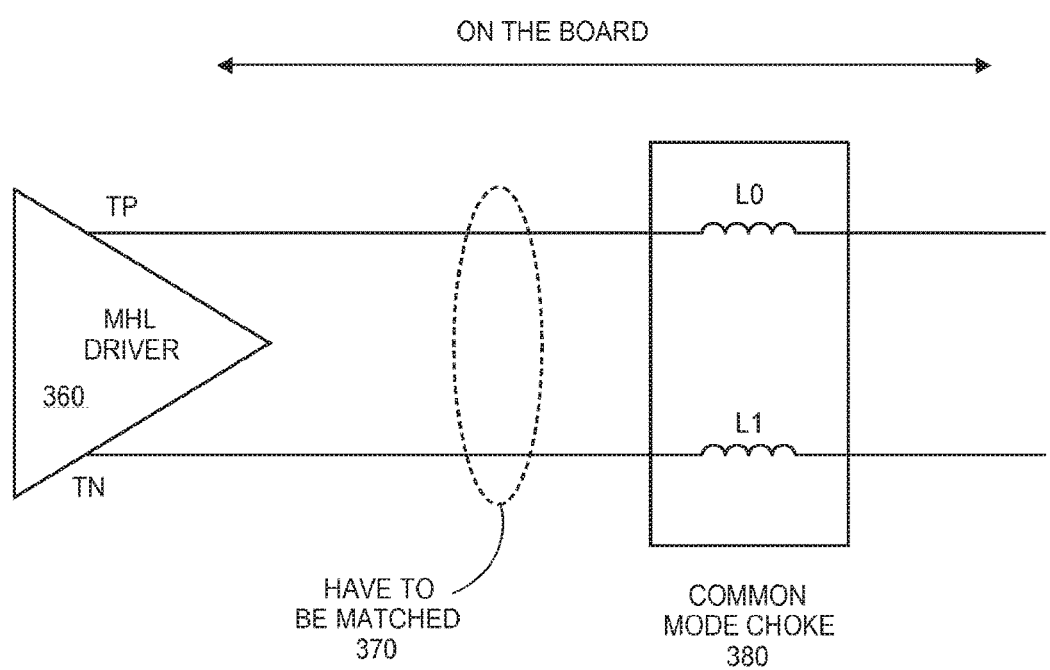
FIG. 3A is an illustration of a conventional apparatus to control transition time of a common mode signal.

FIG. 3A is an illustration of a conventional apparatus to control transition time of a common mode signal. In this illustration, an MHL driver 360 having output connections (pins) TP and TN is coupled via cable connectors 370 (which are required to be matched) to a common mode choke 380, illustrated as inductors L0 and L1.

For EMI control, an external choke is generally provided on the board, with expensive strip-line design commonly being required. In theory, the choke attenuates only the common mode signal, without affecting the differential data. In practice, differential data may be affected by the choke. In addition, any difference in value between the inductors L0 and L1 on the two nets manifests itself as CM-DM conversion.

In this illustration, rise/fall time of the common mode signal is controlled outside the chip. Inside the chip the transients are very fast. The fast rise/fall time of the common mode current generates large supply noise and ground bounce problems on a chip, thus causing jitter unless good power-supply rejection is attained everywhere in the chip.

In some embodiments, an apparatus or system to control the common mode slew rate is provided. In some embodiments, slew rate control may be used to eliminate the need for a common mode choke to reduce the rise/fall time in a controlled manner, thus reducing system cost. Since the rise/fall times inside the chip are regulated, smaller decoupling capacitors may be required. This also reduces area (and thus cost of production).

Figure 4:
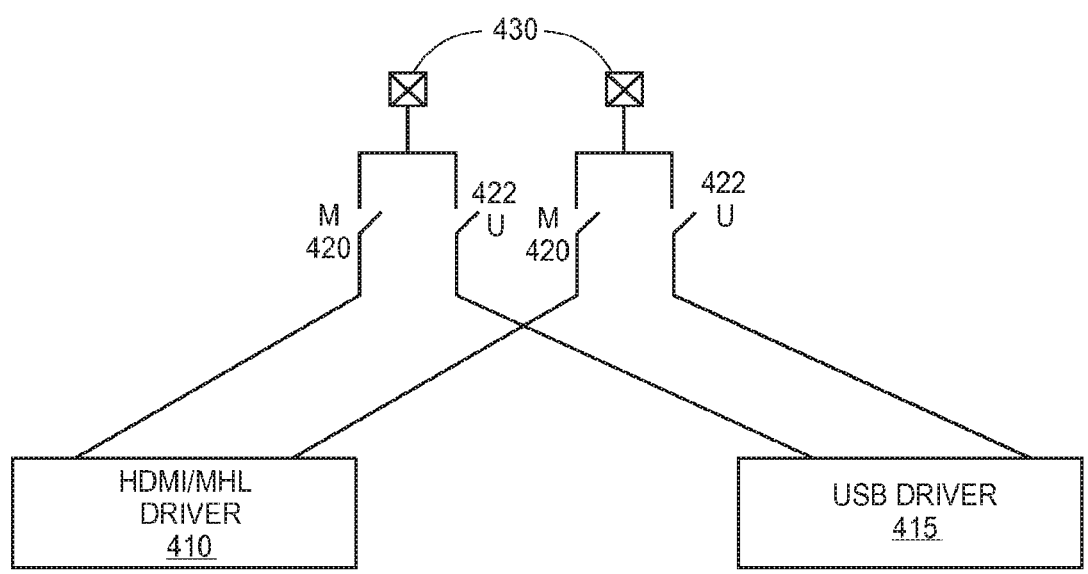
FIG. 4 illustrates an embodiment of an apparatus or system to provide multiple data protocols on a single set of pins.

FIG. 4 illustrates an embodiment of an apparatus or system to provide multiple data protocols on a single set of pins. In some embodiments, an HDMI and MHL driver 410 and a USB driver 415 utilize a single set of pins 430 for data transmission. In some embodiments, the architecture utilizes two sets of switches, a first set of switches 420 (designated as M for MHL) for HDMI/MHL data and a second set of switches 422 (designated as U for USB) for USB data. However, the MHL switches 420 are required to have a very high bandwidth to pass high frequency MHL and HDMI data. For example, for 3 Gbps operation, at least 1.5 GHz of bandwidth is required, and, for good system margins, 2 GHz is generally needed. However, additional switches generate additional capacitive loading at the output, thereby further reducing bandwidth.

Figure 5:
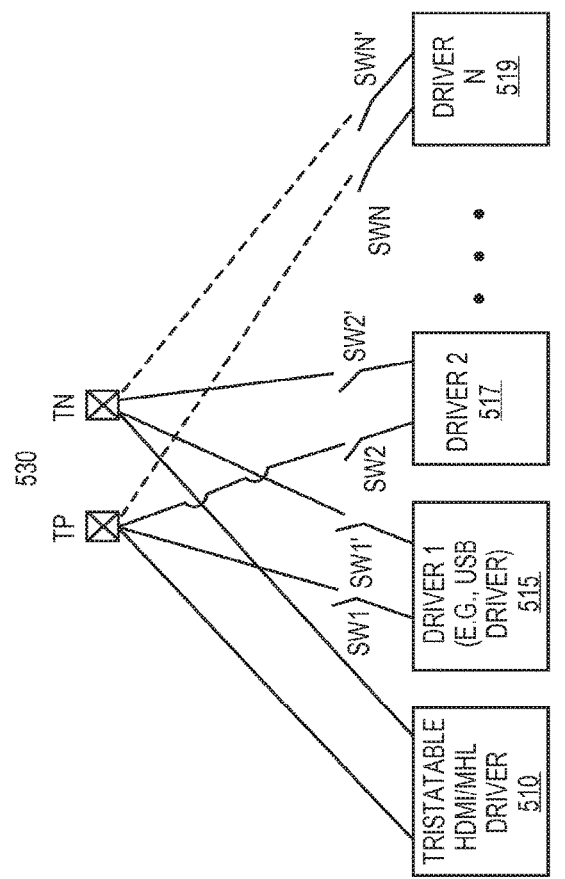
FIG. 5 illustrates an embodiment of an apparatus or system to provide multiple data protocols on a single set of pins without switches in the signal path.
Figure 5:
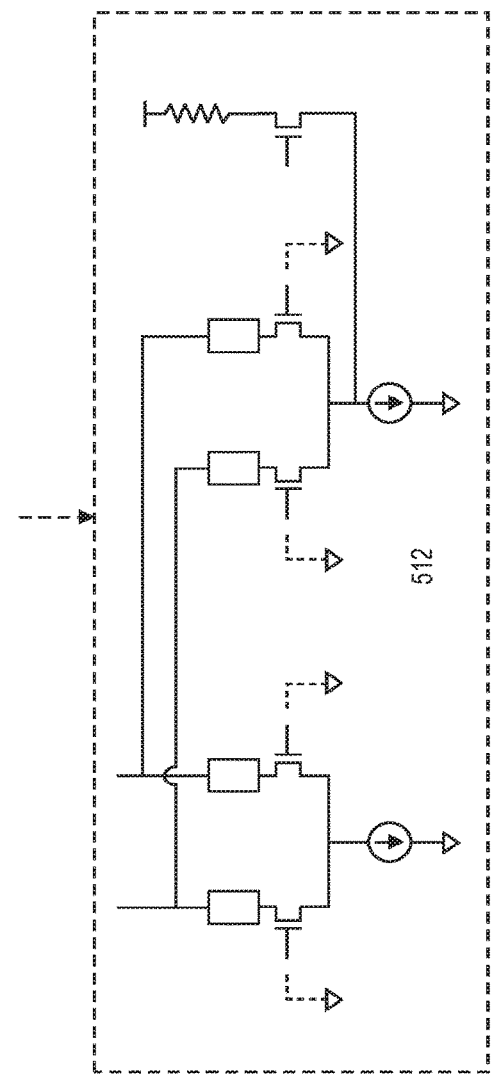

FIG. 5 illustrates an embodiment of an apparatus or system to provide multiple data protocols on a single set of pins without switches in the HDMI/MHL signal path. In some embodiments, a system or apparatus provides for an HDMI and MHL driver 510 and one or more other drivers, illustrated as Driver 1 515, such as a USB driver, Driver 2 517, and potentially continuing through Driver N 519. In some embodiments, the drivers utilize a single set of pins 530 (TP and TN) of an IC (integrated circuit) for data transmission. As illustrated, the one or other drivers are switchable, with Driver-1 switched by SW1 and SW1', Driver 2 switched by SW2, and potentially continuing through Driver N switched by SWN and SWN'.

In some embodiments, the HDMI/MHL driver is tristateable (the circuit shown as 512). In this illustration, the driver 510 may be tristated when not active, and may be tolerant to, for example, 5.5V. In some embodiments, the driver 510 connects to the pads directly, and in USB mode the HDMI/MHL driver is tristated. In some embodiments, the switches of the one or more other drivers, which may include one or more USB switches, are provided, but the apparatus or system does not include MHL side switches because such switches are not required.

In some embodiments, because MHL mode data is transferred without a switch, switch bandwidth is not an issue for the apparatus. In addition, capacitance loading of one switch is removed from the set of pins or pads. In some embodiments, the operation of the apparatus or system with a tristateable HDMI/MHL driver allows for improvement of speed and eye diagram performance for the driver. However, the architecture illustrated in FIG. 5 is not implementable if the HDMI/MHL driver has a termination resistance that cannot be turned off. The termination resistance of a prior art MHL implementation (such as illustrated in FIG. 3) is difficult to turn off. Thus, such a driver is generally not suitable for this implementation.

Figure 6:
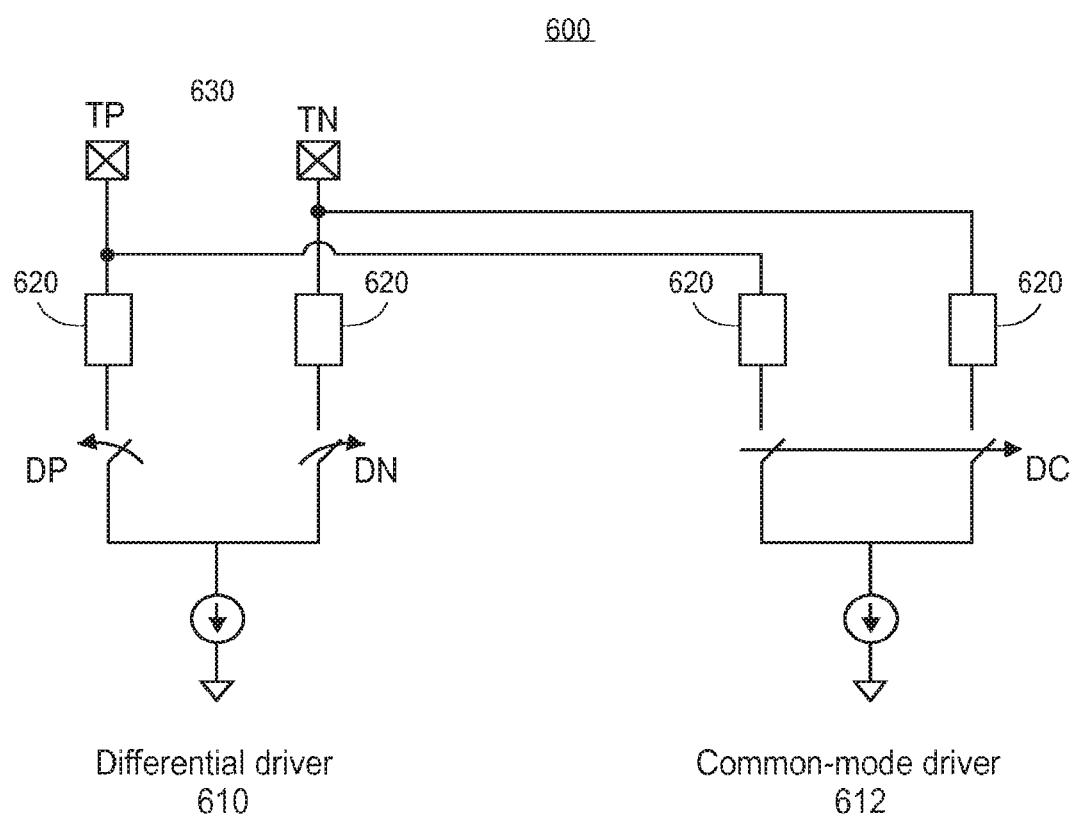
FIG. 6 illustrates an embodiment of a driver.

FIG. 6 illustrates an embodiment of a driver. In some embodiments, a first differential driver element 610 of a driver 600 includes a parallel path for common mode signals. The common mode signals may be, for example, clock signals at frequencies substantially lower than the frequency of differential data. In some embodiments, the driver 600 may be used for HDMI and MHL modes of transmission. If the common mode signal path is not enabled, the driver operates as an HDMI driver. In this case the common mode signal input is driven to ground voltage. If a low frequency clock is used a common mode signal, the transmitter operates as an MHL driver. The common mode signal may or may not be synchronous with differential data. In some embodiments, the switches in both common mode and differential paths may or may not be cascoded with protection devices 620.

In some embodiments, the driver 600 includes the first driver element 610 to drive a differential signal (where DP and DN are either '10' or '01', depending on whether data is 1 or 0). In some embodiments, the driver 600 includes a second driver element 612 to drive a common mode signal (by delivering an equal amount of common mode current to both TP and TN). In the second driver element 612, ideally there is common mode current if DC is high and otherwise there is no current.

In some embodiments, the architecture of driver 600 has no termination resistor. In some embodiments, if all switches of the driver 600 are OFF, the impedance presented to the pads is high on both TP and TN. In some embodiments, the architecture in FIG. 6 may be utilized to eliminate the USB switch. In some embodiments, if DC switch is turned off permanently, the driver 600 can meet HDMI specifications, which is not possible with conventional circuits having a termination resistance.

Figure 7:
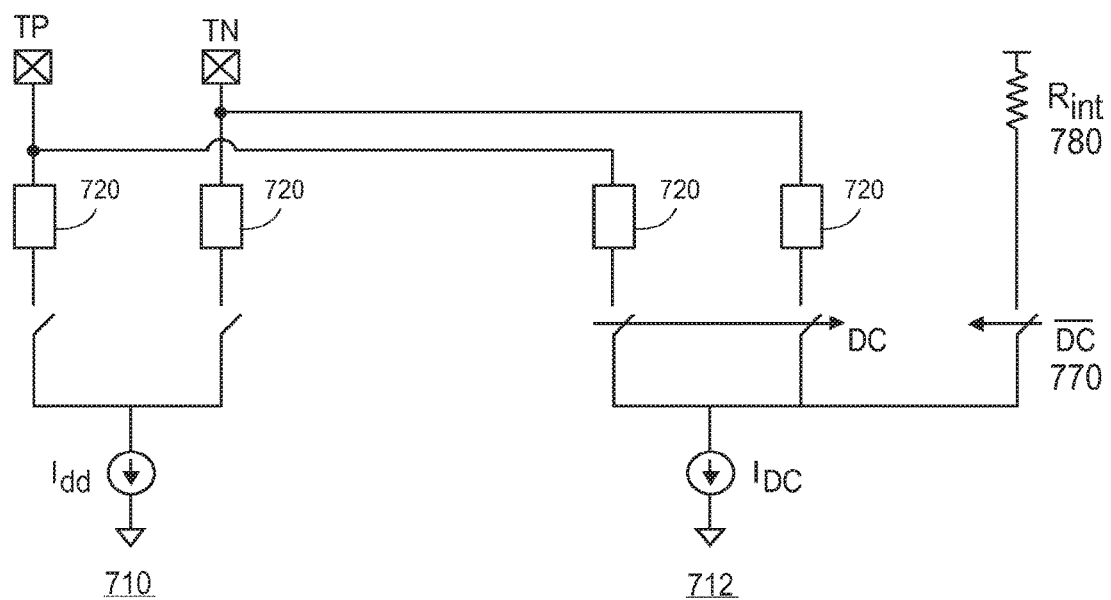
FIG. 7 is an illustration of an embodiment of a multi-mode driver.

FIG. 7 is an illustration of an embodiment of a multimode driver. In some embodiments, a current source of a common mode signal may be shared with another switch, which is complementary to this common mode signal. The complementary switch current optionally goes through an internal load $R_{int}$ 780. $R_{int}$ refers to some load, which may be actual resistors or transistors. In some embodiments, the driver 700 includes a differential mode driver element 710 and a common mode driver element 712. In some embodiments, the current source of the common mode signal may be shared with another switch 770, which is complementary to this common mode signal. Thus the current in this current source remains constant. In some embodiments, the circuit:

(1) Reduces the Turn-ON, Turn-OFF times for the current source $I_{DC}$; and (2) Provides generally constant current into ground regardless of the signal state, thus acting to reduce or eliminate ground bounce due to common mode current and providing improvement in management of jitter and other effects on a chip.

Figure 8:
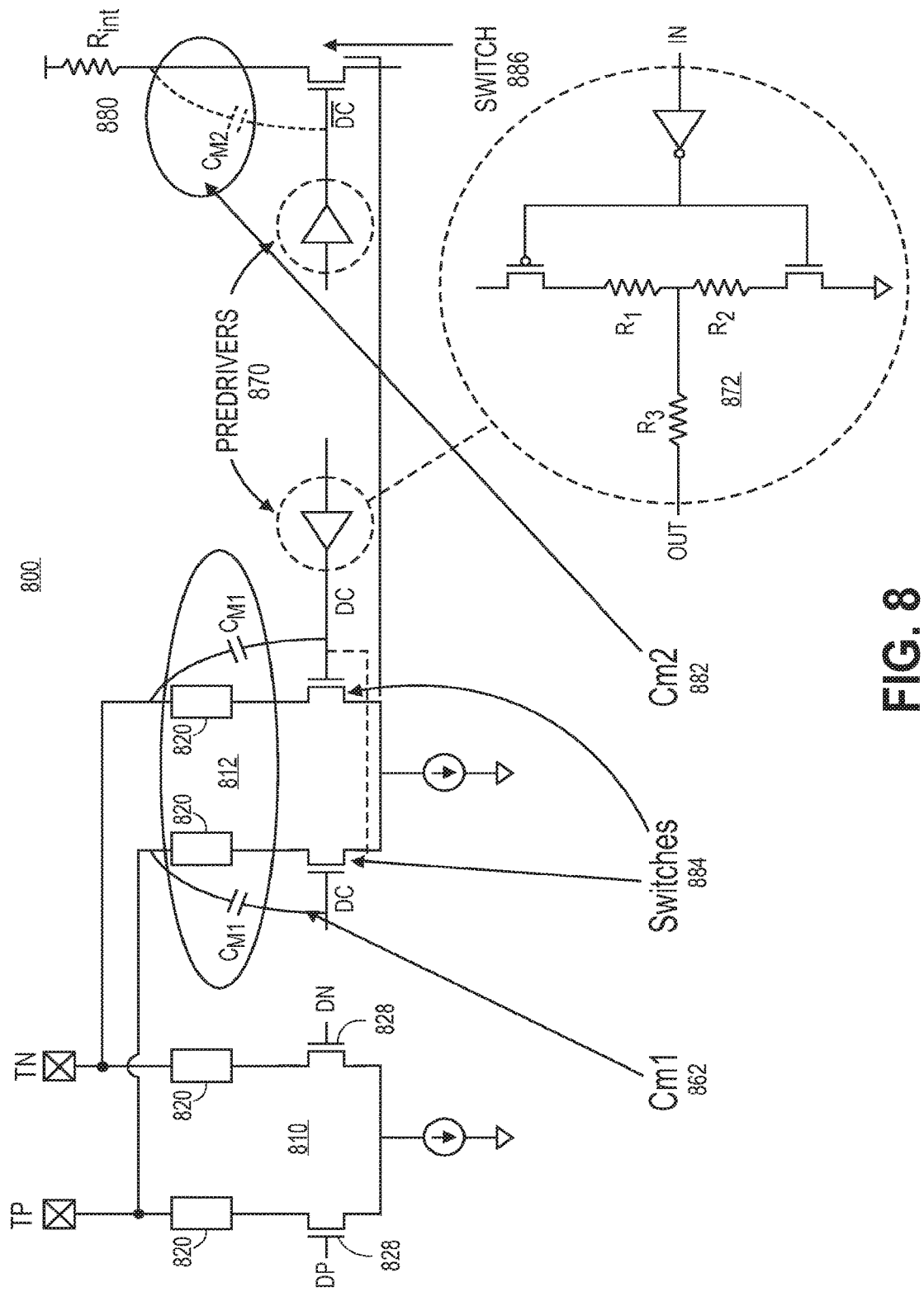
FIG. 8 is an illustration of an embodiment of a multi-mode driver.

FIG. 8 is an illustration of an embodiment of a multimode driver. In some embodiments, the driver 800 includes a differential mode driver element 810 and a common mode driver element 812. Because common mode signals can cause EMI, the rise/fall time of such signals should be large. This may be accomplished by adding "Miller" capacitance ($C_{M1}$ 862) between the input and output of the common mode driver. The switch (together with its load) in the common mode driver may be seen as an amplifier that has Miller capacitance between input and output. In some embodiments, each of a first and second branch of the differential mode driver element 810 and a third and fourth branch of common mode driver element 812 includes an optional protection device 820 coupled between a switching device 828 or 884 and the TP (which may be referred to as a first pad) or TN pad (which may be referred to a second pad). In some embodiments, the driver 800 further includes internal load $R_{int}$ 880 switching device 886.

In some embodiments, because the common mode signal switch and complementary switch form a differential pair, the rise/fall time may also be adjusted by adding a second Miller capacitance "$C_{M2}$" 882 at the complementary switch. This configuration does not add any extra capacitance to the output pads (TP and TN). In some embodiments, the driver may either have $C_{M1}$, $C_{M2}$, or both.

In some embodiments, the switches for the common mode driver and the 'Miller' capacitance are driven by pre-drivers 870. In some embodiments, the predrivers 870 may be simple inverters or inverters followed by resistances. In some embodiments, different resistances may be added in the rise and fall paths of the predrivers 870 to regulate rise/fall time on the common mode signal, as required. The pre-driver 870 driving the complementary path may have different resistances than the main path. In some embodiments, a pre-driver may be structured as shown in circuit 872.

In some embodiments, the driver 800 provides for control of common mode rise/fall time, including changes that may be made post-production of a chip. In some embodiments, the control allows for reduction of EMI of the chip without using external common mode choke. In contrast, conventional designs have no control over this aspect, and thus an external choke is generally required to control EMI.

Further, if rise/fall time of the common mode driver is increased, the ground-bounce/supply-noise is reduced on the chip. As a result, in manufacture constraints on supply routing and packaging may be relaxed, while at the same time supply induced jitter is reduced. Further, lower supply voltages may be used for the IP, thereby satisfying needs of a wider range of users.

In some embodiments, one or more Miller capacitors ($C_{M1}$ 862 or $C_{M2}$ 882) are added. In some embodiments, the added capacitors and the design of switch NFETs connected to DC or its complement (shown as DC bar) or both (along with the inverters driving these two signals) enable control of the rise/fall times of the common mode signal at TP+TN. In some embodiments, if the $C_{M2}$ capacitor only is used, there is no additional loading on TP and TN.

In some embodiments, an inverter driving DC and its complement 872 includes resistors R1, R2, and R3. In some embodiments, by controlling the values of R1, R2 and R3, together with the switches and capacitors $C_{M1}$ and $C_{M2}$, the rise/fall time may be easily manipulated.

Figure 9:
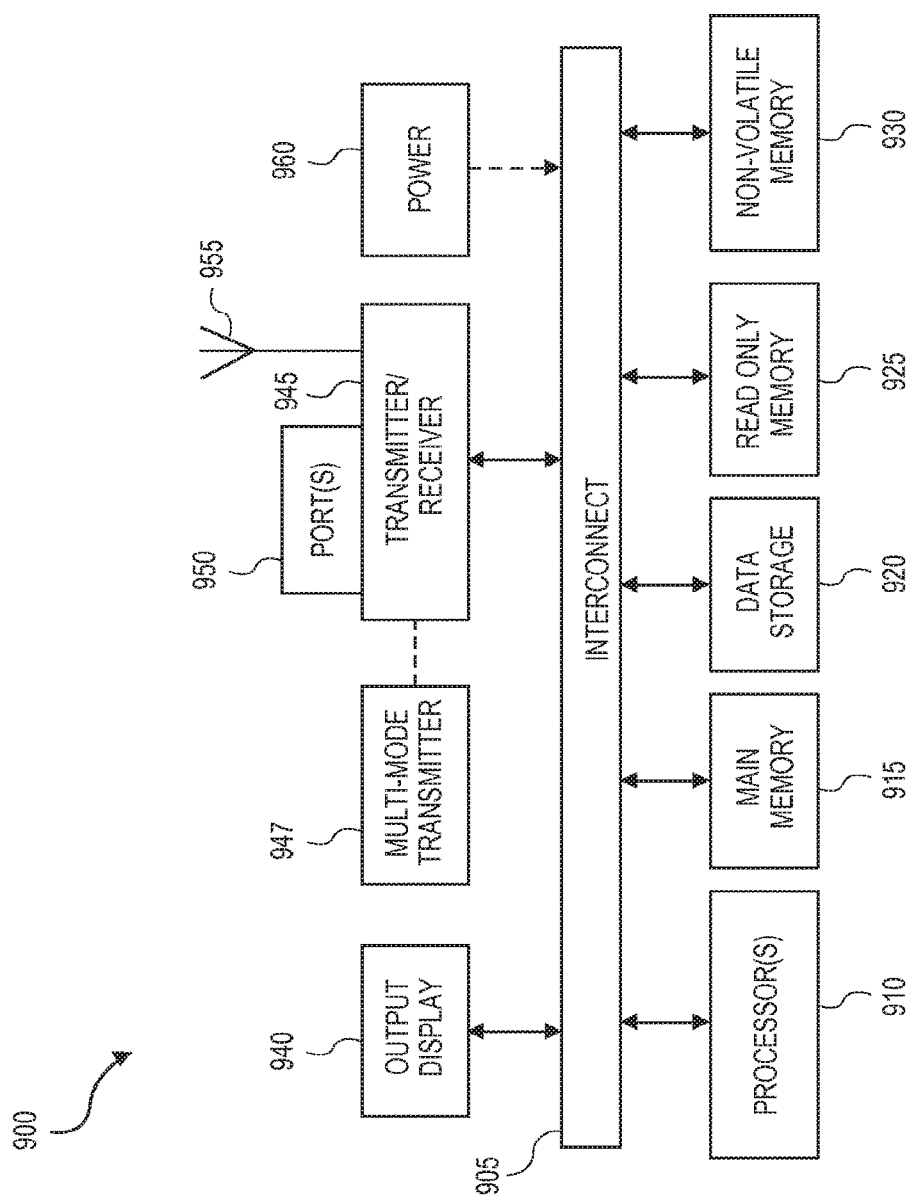
FIG. 9 illustrates an embodiment of an electronic device.

FIG. 9 illustrates an embodiment of an electronic device. In this illustration, certain standard and well-known components that are not germane to the present description are not shown. In some embodiments, a device 900 may be a sink device compatible with a first protocol, such as an MHL sink device, that may receive a cable connection from another device. In some embodiments, the device 900 may be a source device connected via cable to a device.

Under some embodiments, the device 900 comprises an interconnect or crossbar 905 or other communication means for transmission of data. The data may include various types of data, including, for example, audio-visual data and related control data. The device 900 may include a processing means such as one or more processors 910 coupled with the interconnect 905 for processing information. The processors 910 may comprise one or more physical processors and one or more logical processors. Further, each of the processors 910 may include multiple processor cores. The interconnect 905 is illustrated as a single interconnect for simplicity, but may represent multiple different interconnects or buses and the component connections to such interconnects may vary. The interconnect 905 shown in FIG. 9 is an abstraction that represents any one or more separate physical buses, point-to-point connections, or both connected by appropriate bridges, adapters, or controllers. The interconnect 905 may include, for example, a system bus, a PCI or PCIe bus, a HyperTransport or industry standard architecture (ISA) bus, a small computer system interface (SCSI) bus, a IIC (I2C) bus, or an Institute of Electrical and Electronics Engineers (IEEE) standard 1394 bus, sometimes referred to as "Firewire". ("Standard for a High Performance Serial Bus" 1394-1995, IEEE, published Aug. 30, 1996, and supplements)

In some embodiments, the device 900 further comprises a random access memory (RAM) or other dynamic storage device as a main memory 915 for storing information and instructions to be executed by the processors 910. Main memory 915 also may be used for storing data for data streams or sub-streams. RAM memory includes dynamic random access memory (DRAM), which requires refreshing of memory contents, and static random access memory (SRAM), which does not require refreshing contents, but at increased cost. DRAM memory may include synchronous dynamic random access memory (SDRAM), which includes a clock signal to control signals, and extended data-out dynamic random access memory (EDO DRAM). In some embodiments, memory of the system may certain registers or other special purpose memory. The device 900 also may comprise a read only memory (ROM) 925 or other static storage device for storing static information and instructions for the processors 910. The device 900 may include one or more non-volatile memory elements 930 for the storage of certain elements.

Data storage 920 may also be coupled to the interconnect 905 of the device 900 for storing information and instructions. The data storage 920 may include a magnetic disk, solid-state drive (SSD), or other storage device. Such elements may be combined together or may be separate components, and utilize parts of other elements of the device 900.

The device 900 may also be coupled via the interconnect 905 to an output display or presentation device 940. In some embodiments, the display 940 may include a liquid crystal display (LCD), plasma display, or any other display technology for displaying information or content to an end user. In some environments, the display 940 may include a touch-screen that is also utilized as at least a part of an input device. In some environments, the display 940 may be or may include an audio device, such as a speaker for providing audio information, including the audio portion of a television program.

One or more transmitters or receivers 945 may also be coupled to the interconnect 905. In some embodiments, the device 900 may include one or more ports 950 for the reception or transmission of data. In some embodiments, at least one port may utilize a connector (such as a receptacle for a cable plug) compatible with a second protocol, such an HDMI compatible connector. In some embodiments, the device 900 operates to detect a cable connection for a first protocol device by the detection of a certain voltage at a sense pin of the connector, such as a voltage that is above a certain threshold.

In some embodiments, a transmitter 947 is a multi-mode transmitter, such as illustrated in FIGS. 5 through 8.

The device 900 may further include one or more antennas 955 for the reception of data via radio signals. The device 900 may also comprise a power device or system 960, which may comprise a power supply, a battery, a solar cell, a fuel cell, or other system or device for providing or generating power. The power provided by the power device or system 960 may be distributed as required to elements of the device 900.

Figure 10A:
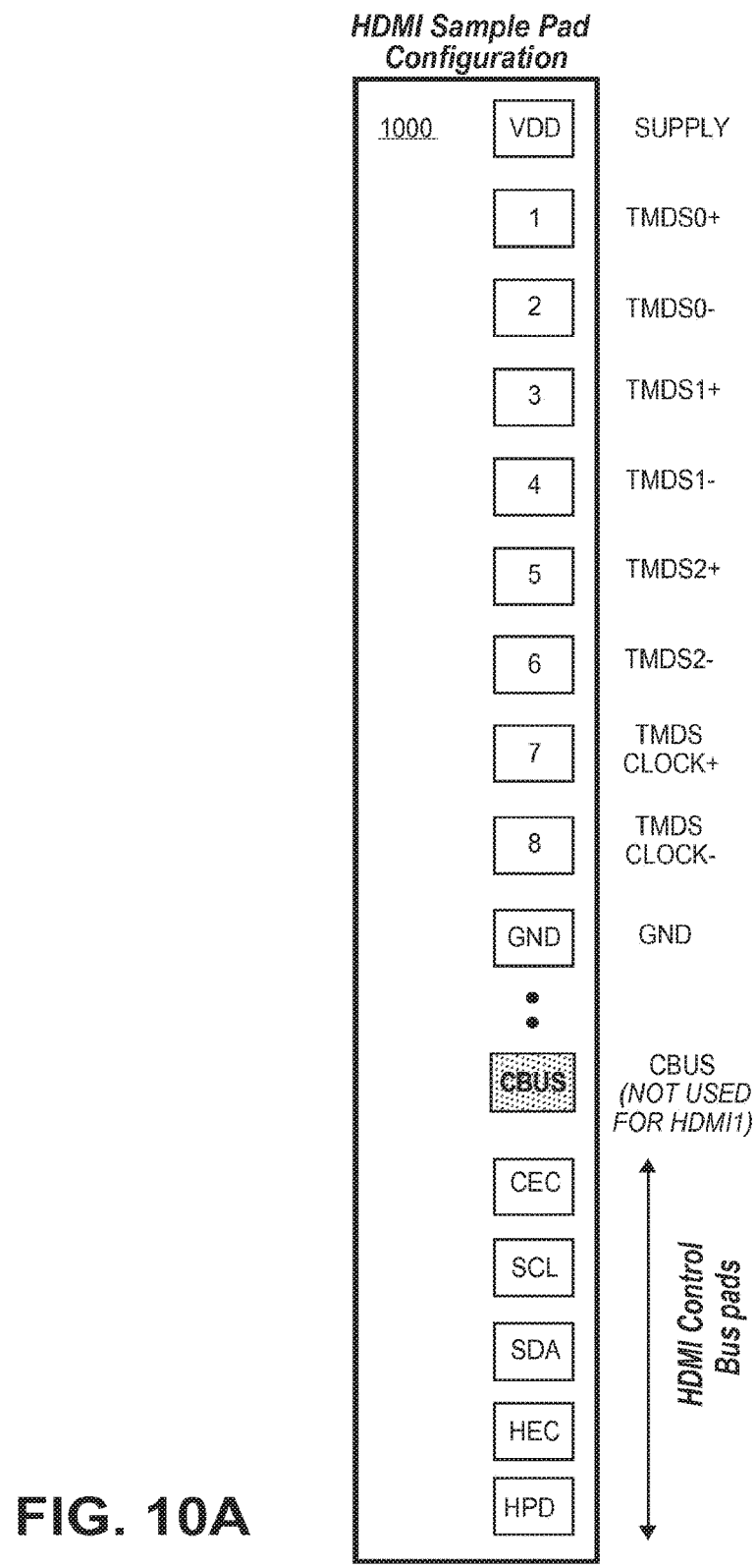
FIGS. 10A and 10B are illustrations of pad configurations for use in an embodiment of an apparatus or system.
Figure 10B:
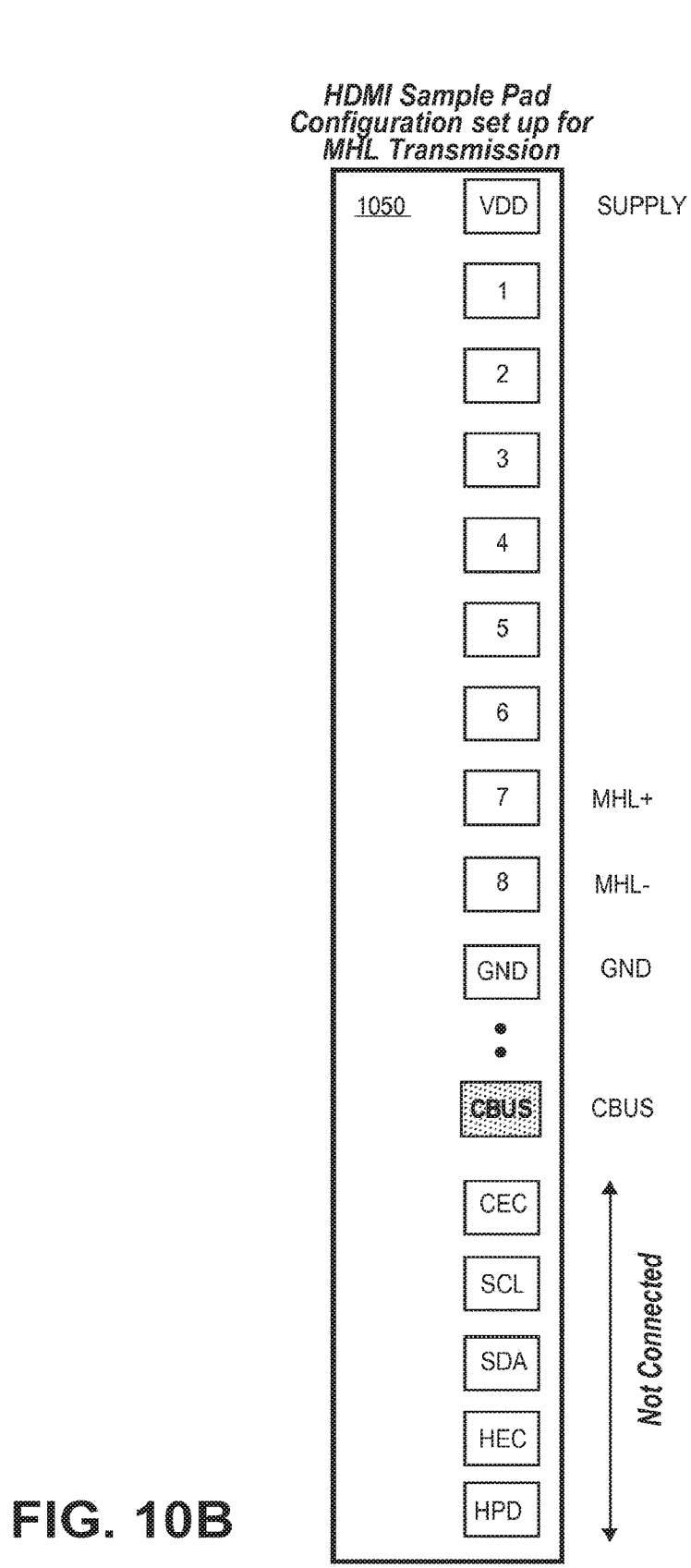

In some embodiments, an apparatus, system, or method includes using part of a set of HDMI I/O pins to transmit alternative data protocols, such as MHL. FIGS. 10A and 10B are illustrations of pad configurations for use in an embodiment of an apparatus or system. FIG. 10A illustrates an implementation of a pad configuration 1000 of an integrated circuit that is designed for providing a HDMI interface. It is noted that other implementations may include several additional pads (not shown here) that connect to voltage supplies. In this illustration, pads are provided for a voltage supply (VDD); three TMDS (Transition-Minimized Differential Signaling) differential data channels (TMDS0+ and TMDS0−; TMDS1+ and TMDS1−; TMDS2+ and TMDS2−); a differential clock channel (TMDS Clock+ and TMDS Clock−); ground (GND); and a set of HDMI control pads (CEC (Consumer Electronics Control), SCL (Serial Clock) for DDC (Display Data Channel), SDA (Serial Data) for DDC, HEC (HDMI Ethernet Channel), HPD). Also included is a control bus (CBUS) pad that is not used for HDMI.

FIG. 10B illustrates an implementation of a pad configuration 1050 such that an integrated circuit that has been designed for the HDMI interface may be used for the MHL interface by utilizing the appropriate pads. In this illustration, pads are provided for a voltage supply (VDD), MHL data (MHL+ and MHL−), a differential clock channel (TMDS Clock+ and TMDS Clock−), ground (GND), and a control bus (CBUS). Also illustrated are the set of HDMI control pads, which are not connected. In comparing FIGS. 10A and 10B, the HDMI pad configuration 1000 includes the CBUS pad that is utilized for the MHL interface. In this particular embodiment, the clock pads for HDMI in FIG. 10A are used for the MHL data interface in FIG. 10B. In some embodiments, the MHL interface can be used with other HDMI pads as well, if the MHL circuitry is implemented for the respective pad or pads.

Figure 11:
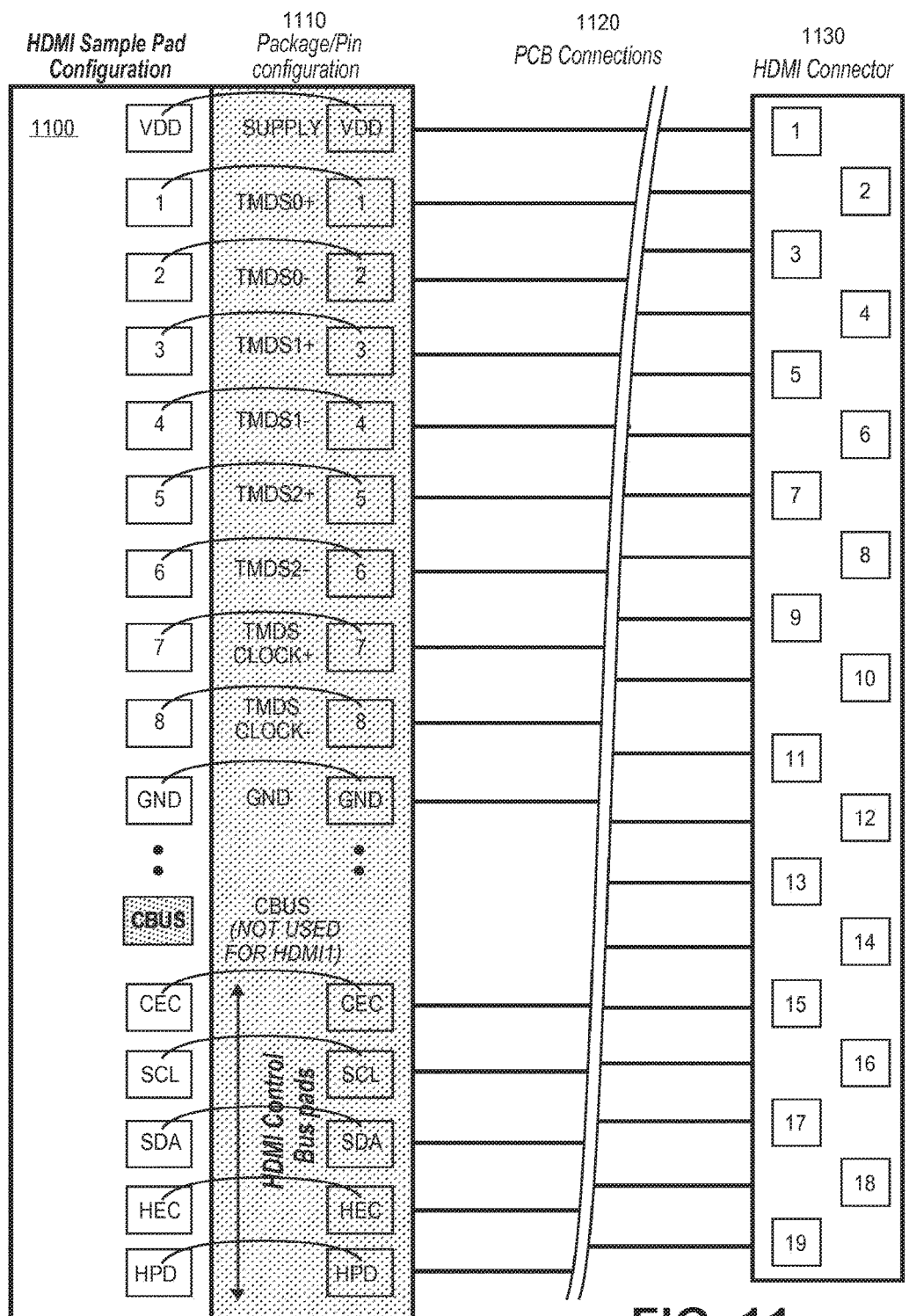
FIG. 11 illustrates an implementation of a pad configuration for connection with a connector according to an embodiment.

FIG. 11 illustrates an implementation of a pad configuration for connection with a connector according to an embodiment, wherein the illustrated pad configuration and connector are HDMI elements. In this illustration, a representative application is shown in which pads of the illustrated HDMI pad configuration 1100 are connected (bonded) to respective pins on the package, illustrated as the package/pin configuration 1110, which are further coupled via the layout of PCB (Printed Circuit Board) connections 1120 to the HDMI connector 1130. In some embodiments, one or more pads of the pad configuration 1100, such as the CBUS, that are used for MHL are not connected (bonded) for HDMI.

Figure 12:
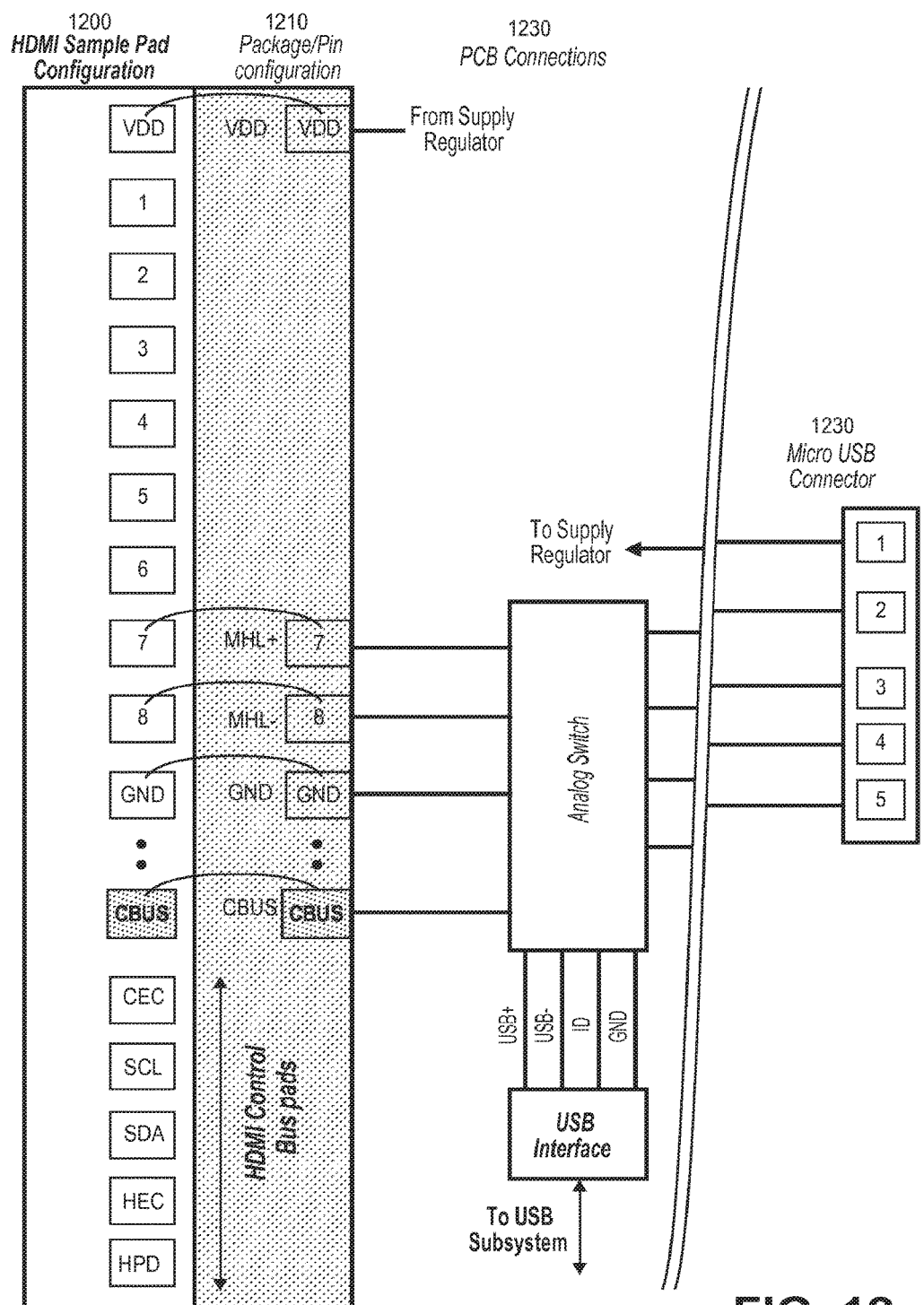
FIG. 12 illustrates an implementation of a pad configuration for connection with a connector according to an embodiment.

FIG. 12 illustrates an implementation of a pad configuration for connection with a connector according to an embodiment, wherein the illustrated pad configuration provides for connection to an MHL connector. In this illustration, a representative application is shown in which pads of the illustrated HDMI pad configuration 1200 are connected to respective pins on the package, illustrated as the package/pin configuration 1210, which are further coupled via the layout of PCB connections 1220 to the MHL/MicroUSB connector 1230. However, in the case of MHL transmission, several of the HDMI pads of the pad configuration 1200 are not connected, and only the TMDS CLOCK signal pads are now used as MHL pads. Further, the CBUS pad is utilized for connection. Other HDMI signal pads, such as TMDS1+/TMDS1−, can also be used for MHL using a similar logic. However, the TMDS CLOCK outputs may provide a better trade off between performance and power when using either HDMI or MHL.

Figure 13:
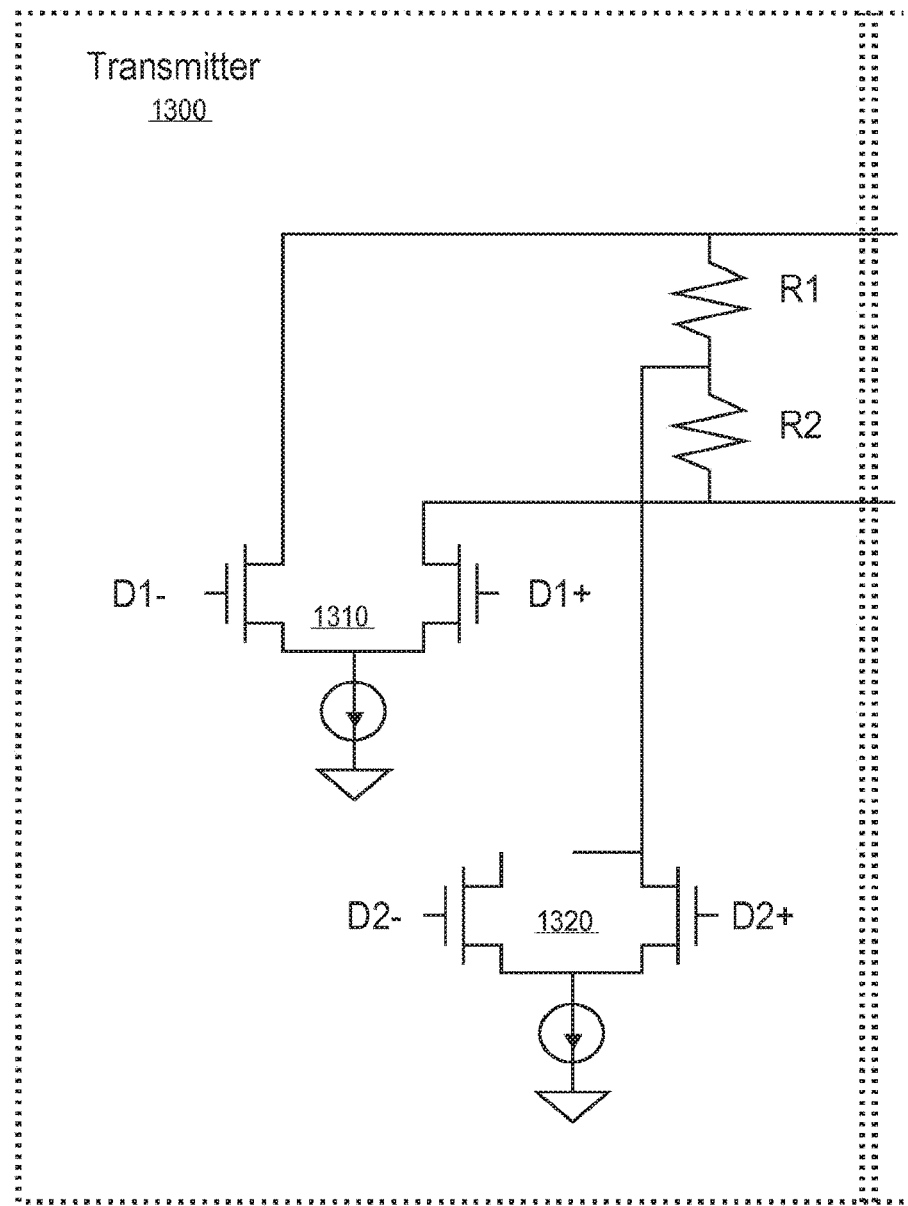
FIG. 13 illustrates is an illustration of a driver implementation according to an embodiment.

FIG. 13 is an illustration of a driver implementation. FIG. 13 illustrates a driver implementation that may be utilized to transmit either HDMI or MHL data, and is a portion of the circuit illustrated in FIG. 3. As illustrated, a driver implementation may includes a D1+/D1− path coupled to R1 and R2, and a D2+/D2− path with a connection to the node between R1 and R2. In this illustration, for HDMI transmission only, the D1+/D1− path 1310 is used (turned ON), with the path through D2+/D2− 1320 shut off. For MHL transmission both paths 1310 and 1320 are ON and the path through D2+/D2− provides the common-mode clocking necessary for compliance with the MHL specifications. However, implementations are not limited to the illustrated circuit, which is an example of a possible circuit arrangement. The MHL common-mode clocking can also be provided by other circuit techniques in other embodiments. For example, by modulating the current source of D1/D1− differential pair a similar effect of common-mode signaling can be obtained.

The illustrations provided in FIGS. 10A to 13 regard implementation of embodiments for HDMI and MHL technology, but embodiments are not limited to these technologies. In some embodiments, circuits may be implement to support, for example, other audio/video standards.

Figure 14:
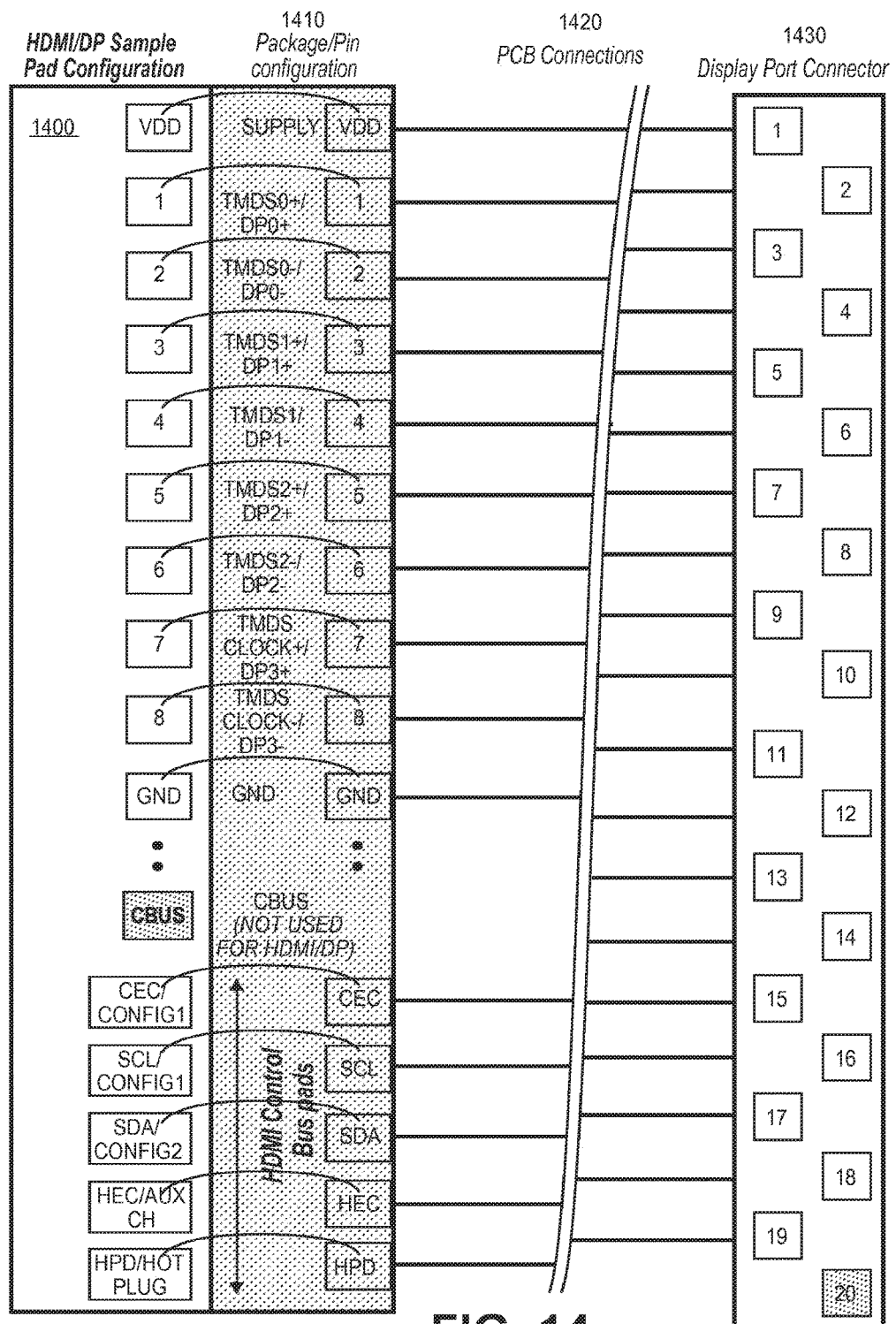
FIG. 14 illustrates an implementation of a pad configuration for connection with a connector according to an embodiment.

FIG. 14 illustrates an implementation of a pad configuration for connection with a connector according to an embodiment, wherein the illustrated pad configuration provides for connection to a DisplayPort (DP) connector. In this illustration, a representative application is shown in which pads of the illustrated pad configuration 1400 are connected to respective pins on the package, illustrated as the package/pin configuration 1410, which are further coupled via the layout of PCB connections 1420 to the DisplayPort connector 1430. In some embodiments, one or more pads of the pad configuration 1400, such as the CBUS, are not connected for DisplayPort. FIG. 14 provides an example of an implementation in which a same integrated circuit may be used either for HDMI or DisplayPort or MHL data transmission. In this example, for high-speed signal lines the driver can be designed such that it can transmit either HDMI or DisplayPort signals. In HDMI mode, the termination necessary for DisplayPort can be switched off while driving the HDMI compliant signals. For control buses, the signals can be multiplexed between HDMI and DisplayPort control buses. Depending on the mode, appropriate settings may be set such that the appropriate bus protocol is transmitted on the pads and pins of the package. In this illustration, MHL data transmission may also be implemented by using the CBUS and other connections that are necessary for MHL. As shown in 12, the TMDS CLOCK+/TMDS CLOCK− and CBUS pads may be used for MHL transmission while the other pads do not need not be connected to the package.

In another embodiment, all the signal pads may be connected to the package. The package pins, may be chosen based on the respective data transmission protocol, at the board level.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described. The illustrated elements or components may also be arranged in different arrangements or orders, including the reordering of any fields or the modification of field sizes.

The present invention may include various processes. The processes of the present invention may be performed by hardware components or may be embodied in computer-readable instructions, which may be used to cause a general purpose or special purpose processor or logic circuits programmed with the instructions to perform the processes.

Alternatively, the processes may be performed by a combination of hardware and software.

Portions of the present invention may be provided as a computer program product, which may include a computer-readable non-transitory storage medium having stored thereon computer program instructions, which may be used to program a computer (or other electronic devices) to perform a process according to the present invention. The computer-readable storage medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of media/computer-readable medium suitable for storing electronic instructions. Moreover, the present invention may also be downloaded as a computer program product, wherein the program may be transferred from a remote computer to a requesting computer.

Many of the methods are described in their most basic form, but processes may be added to or deleted from any of the methods and information may be added or subtracted from any of the described messages without departing from the basic scope of the present invention. It will be apparent to those skilled in the art that many further modifications and adaptations may be made. The particular embodiments are not provided to limit the invention but to illustrate it.

If it is said that an element "A" is coupled to or with element "B," element A may be directly coupled to element B or be indirectly coupled through, for example, element C. When the specification states that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification refers to "a" or "an" element, this does not mean there is only one of the described elements.

An embodiment is an implementation or example of the invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects.

In some embodiments, an apparatus includes a transmitter connected to two pads on an IC (integrated circuit), the transmitter including: a differential driver to transmit a differential signal, wherein the differential driver has a first branch and a second branch, wherein each branch of the differential driver includes a protection device connected to one of the pads, the first branch of the differential driver having a first protection device and the second branch of the differential driver having a second protection device, each of the first and second protection devices having at least two terminals; and a common mode driver to transmit a common mode signal, wherein the common mode driver has a first branch and a second branch, each of the first and second branches of the common mode driver including a protection device connected to one of the pads, the first branch of the common mode driver including a third protection device and the second branch of the common mode driver including a fourth protection device, each of the third and fourth protection devices having at least two terminals. In some embodiments, each of the first and second protection devices is further connected to a first end of a switch device on a terminal of the protection device that is not connected to a pad, the first protection device being coupled with a first end of a first switch device and the second protection device being coupled with a first end of a second switch device, wherein a second end of the first switch device and a second end of the second switch device are connected to a first end of a first current source, a second end of the first current source being connected to a ground net or any other net. In some embodiments, the first and second switch devices are not turned on simultaneously, and wherein, based on data to be transmitted, one of the first and second switch devices is turned on and the other of the first and second switch devices is turned off. In some embodiments, each of the third and fourth protection devices is further connected to a first end of a switch device on a terminal that is not connected to a pad, the third protection device being coupled with a first end of a third switch device and the fourth protection device being coupled with a first end of a fourth switch device, wherein a second end of the third switch device and a second end of the fourth switch device are connected with a first end of a second current source, wherein a second end of each of the second current sources is connected to a ground net or any other net. In some embodiments, the third and fourth switch devices are both turned on when the common mode signal is one of a logic HIGH or logic LOW and the third and fourth switch devices are both turned off when the common mode signal is the other of logic HIGH or logic LOW.

In some embodiments, the common mode signal is optionally synchronous with the differential signal.

In some embodiments, each protection device of the apparatus is implemented using a transistor, a diode, or a resistance device.

In some embodiments, each switch device of the apparatus is implemented using a transistor or a combination of transistors.

In some embodiments, the common mode driver further includes a fifth switch device, and wherein a first end of the fifth switch device is connected to the first end of a current source. In some embodiments, a second end of the fifth switch device connects to a common node via a resistance. In some embodiments, the common node is a power supply. In some embodiments, the resistance is one of a wire resistance or an explicit device. In some embodiments, the resistance is a device providing non-linear resistance. In some embodiments, the fifth switch device connecting to the common-node or power supply is on when the third and fourth switch devices are off and is off when the third and fourth switch devices are on.

In some embodiments, the apparatus further includes independent or correlated slew rate control for turning on and off the third switch device, the fourth switch device, and the fifth switch device. In some embodiments, the slew rate control includes one or more of Miller capacitance and resistances.

In some embodiments, the apparatus further includes a first capacitor having a first terminal connected to a control node of one of the third or fourth switch devices and a second terminal connected to either the pad to which the switch device is connected or the pad-side of the switch device. In some embodiments, the apparatus further includes a second capacitor having a first terminal connected to a control node of the other of the third and fourth switch devices of the common mode driver and a second terminal connected to either the pad to which the switch device is connected or a pad-side of the switch device.

In some embodiments, the apparatus further includes a third capacitor having a first terminal connected to a control-node of the fifth switch device and a second node connected to a resistance-side terminal of the switch device.

In some embodiments, one or more circuits driving control terminals of the third, fourth, and fifth switch devices include a resistance inserted between the control terminal and a corresponding driver circuit. In some embodiments, the circuits driving the control nodes of the third, fourth, and fifth switch devices have different output resistances for driving logic HIGH and for driving logic LOW.

In some embodiments, the apparatus further includes an additional circuit connected to the two pads, wherein the additional circuit includes: one or more switch devices on each pad; one or more drivers or receivers of a protocol that is different than a protocol of the transmitter on each pad; or a combination of switches and driver and receiver circuits of the different protocol on each pad. In some embodiments, when any part of the additional circuit is turned on, the common mode driver and differential driver are both nonfunctional. In some embodiments, when the additional circuit is turned on, the common mode driver, the differential driver, or both the common mode and differential drivers draw a current from or supply a current to the two pads in an amount that is insignificant in comparison to current utilized by the additional circuit. In some embodiments, when any part of the additional circuit is turned on the apparatus is in the third mode.

In some embodiments, the apparatus is operable to send TMDS (transition minimized differential signaling) signals compatible with HDMI™ (High Definition Multimedia Interface) protocol then the third, fourth and fifth switch devices are OFF, and where first switch and second switch are used to transmit TMDS data.

In some embodiments, the apparatus is operable for MHL signaling when the first and second switches are used to transmit differential data, and the third and fourth switches are both turned ON or OFF depending on MHL clock.

In some embodiments, a method includes driving a differential signal and a common mode signal on two pads of an IC (integrated circuit) with a transmitter. The transmitter includes a differential driver to transmit the differential signal and a common mode driver to transmit the common mode signal, wherein the differential driver includes a first branch and a second branch, the method further including switching the first branch and the second branch, wherein switching the first branch and the second branch includes disconnecting the first branch when connecting the second branch and disconnecting the second branch when connecting the first branch. The common mode driver includes a third branch and a fourth branch, the method further including switching the third branch and the fourth branch, switching the third branch and the fourth branch includes connecting and disconnecting the third and fourth branches simultaneously. Switching the third and fourth branches includes connecting the third and fourth branches when the common mode signal is one of a logic HIGH or logic LOW and disconnecting the third and fourth branches when the common mode signal is the other of logic HIGH or logic LOW.

In some embodiments, the common mode driver further includes a fifth branch, and further comprising switching the fifth branch.

In some embodiments, driving the differential signal and the common mode signal includes driving the common mode signal synchronously with the differential signal.

In some embodiments, a computer-readable storage medium having stored thereon data representing sequences of instructions that, when executed by a processor, cause the processor to perform operations including driving a differential signal and a common mode signal on two pads of an IC (integrated circuit) with a transmitter. The transmitter includes a differential driver to transmit the differential signal and a common mode driver to transmit the common mode signal. The differential driver includes a first branch and a second branch, the instructions including switching the first branch and the second branch, wherein switching the first branch and the second branch includes disconnecting the first branch when connecting the second branch and disconnecting the second branch when connecting the first branch. The common mode driver includes a third branch and a fourth branch, the instructions including switching the third branch and the fourth branch, switching the third branch and the fourth branch includes connecting and disconnecting the third and fourth branches simultaneously. Switching the third and fourth branches includes connecting the third and fourth branches when the common mode signal is one of a logic HIGH or logic LOW and disconnecting the third and fourth branches when the common mode signal is the other of logic HIGH or logic LOW.

What is claimed is:

1. A driver device, comprising:
    a driver circuit to output data signals to a plurality of signal lines, the driver circuit switchable between a first communication mode in which the data signals conform to a first communication protocol, and a second communication mode in which the data signals conform to a second communication protocol different than the first communication protocol;
    a plurality of termination elements on the plurality of signal lines, the plurality of termination elements switched to an off-state when the driver is in the first communication mode and the plurality of termination elements switched to an on-state when the driver is in the second communication mode;
    a plurality of pads including a plurality of data signal pads coupled to respective ones of the plurality of data signal lines of the driver circuit; and
    a plurality of pins providing external connection points to the plurality of pads, the plurality of pins including at least one data signal pin coupled to a respective one or more of the plurality of data signal pads.

2. The driver device of claim 1, wherein at least one of the plurality of pads is not connected to any of the plurality of pins.

3. The driver device of claim 1, wherein the first communication protocol comprises a HDMI protocol and wherein the second communication protocol comprises a DisplayPort protocol.

4. The driver device of claim 1, wherein the plurality of data signal pads comprise:
    a first differential pair of data signal pads to communicate a TMDS clock when operating in the first communication mode and to communicate a first channel of Display port data when operating in the second communication mode.

5. The driver device of claim 1, wherein the plurality of data signal pads further comprise:
a second differential pair of data signal pads to communicate a first channel of TMDS data when operating in the first communication mode and to communicate a second channel of Display port data when operating in the second communication mode;
a third differential pair of data signal pads to communicate a second channel of TMDS data when operating in the first communication mode and to communicate a third channel of Display port data when operating in the second communication mode;
a fourth differential pair of data signal pads to communicate a third channel of TMDS data when operating in the first communication mode and to communicate a fourth channel of Display port data when operating in the second communication mode.

6. The driver device of claim 1, further comprising:
a multiplexer to receive first communication mode control signals from a first set of a plurality of control buses and to receive second communication mode signals from a second set of the plurality of control buses, and to output the first communication mode control signals to output control buses when the driver circuit is in the first communication mode, and to output the second communication mode signals to the output control buses when the driver circuit is in the second communication mode;
wherein the plurality of pads further comprise a plurality of control signal pads coupled to respective ones of the output control buses from the multiplexer; and
wherein the plurality of pins further comprise a plurality of control signal pins coupled to corresponding ones of the plurality of control signal pads.

7. The driver device of claim 6, wherein the plurality of control signal pads further comprise:
a first control signal pad to communicate CEC data when operating in the first communication mode and to communicate first configuration data when operating in the second communication mode;
a second control signal pad to communicate SCL data when operating in the first communication mode and to communicate the first configuration data when operating in the second communication mode;
a third control signal pad to communicate SDA data when operating in the first communication mode and to communicate second configuration data when operating in the second communication mode;
a fourth control signal pad to communicate HEC data when operating in the first communication mode and to communicate auxiliary channel data when operating in the second communication mode;
a fifth control signal pad to communicate HPD data when operating in the first communication mode and to communicate hot plug data when operating in the second communication mode.

8. The driver device of claim 1, wherein the plurality of pads further comprise:
a plurality of power pads including a power pad and a ground pad.

9. The driver device of claim 1, wherein the driver circuit is further switchable to a third communication mode in which the data signals conform to a third communication protocol.

10. The driver device of claim 9, wherein the first communication protocol comprises an HDMI protocol, the second communication protocol comprises a DisplayPort protocol, and the third communication protocol comprises an MHL protocol.

11. The driver of claim 9, wherein the plurality of pads comprises at least one control signal pad utilized only in the third communication mode and not utilized in the first or second communication modes.

12. The driver device of claim 11, wherein the at least one control signal pad utilized only when operating in the third communication mode is not connected to any of the plurality of pins of the package.

13. The driver device of claim 9,
wherein a first pair of differential pads of the plurality of data signal pads are coupled to a first corresponding pair of the at least one data signal pin, the first pair of differential pads providing a first differential data signal,
wherein a single control signal pad is coupled to a corresponding control signal pin of the plurality of pins, and
wherein remaining ones of the plurality of data signal pads and control signal pads are unconnected to respective ones of the plurality of pins.

* * * * *